(12) United States Patent
Van Ettinger et al.

(10) Patent No.: US 12,689,444 B2
(45) Date of Patent: Jul. 21, 2026

(54) OPTO-ELECTRONIC ASSEMBLIES

(71) Applicant: Hilight Semiconductor Limited, Southampton (GB)

(72) Inventors: Rudolf Van Ettinger, Southampton (GB); Albrecht Johannes Schiff, Southampton (GB); Richard Horn, Southampton (GB)

(73) Assignee: Hilight Semiconductor Limited (GB)

( * ) Notice: Subject to any disclaimer, the term of this patent is extended or adjusted under 35 U.S.C. 154(b) by 339 days.

(21) Appl. No.: 18/388,456

(22) Filed: Nov. 9, 2023

(65) Prior Publication Data

US 2024/0297719 A1 Sep. 5, 2024

(30) Foreign Application Priority Data

Mar. 3, 2023 (GB) ...................................... 2303182

(51) Int. Cl.
H04B 10/60 (2013.01)
H03F 3/45 (2006.01)
H04B 10/25 (2013.01)

(52) U.S. Cl.
CPC ......... H04B 10/60 (2013.01); H03F 3/45475 (2013.01); H04B 10/25 (2013.01);
(Continued)

(58) Field of Classification Search
CPC .. H04B 10/60; H04B 10/693; H04B 10/6931; H03F 3/45475; H03F 2203/45511;
(Continued)

(56) References Cited

U.S. PATENT DOCUMENTS 5,646,763 A 7/1997 Misaizu et al.
6,057,736 A 5/2000 Kim et al.
(Continued)

FOREIGN PATENT DOCUMENTS

CN 118590153 A * 9/2024 ........... G02B 6/4298
EP 0545536 6/1993
(Continued)

OTHER PUBLICATIONS

Redman-White, William; Notice of Allowance for U.S. Appl. No. 18/074,063, filed Dec. 2, 2022, mailed Jan. 17, 2025, 27 pgs.
(Continued)

*Primary Examiner* — Tanya T Motsinger
(74) *Attorney, Agent, or Firm* — Smith, Gambrell & Russell, LLP

(57) ABSTRACT

Assemblies of electronic components for reception of data using optical fibre and methods for providing same. Assemblies comprise a photodiode; an amplifier coupled to the photodiode; at least one feedback resistor coupled between the input and output of the amplifier; an arrangement of at least two MOS transistors of same channel polarity and configured in parallel with the feedback resistor(s); a system for sensing received input signal level and applying a bias voltage to gates of the MOS transistors, the bias voltage varied according to the received input signal level to control a resistance apparent through the arrangement of MOS transistors; at least one capacitor configured to couple signals from the amplifier output to a gate of at least one of the MOS transistors; and at least one bias resistor configured to couple the bias voltage to a gate of at least one of the MOS transistors.

16 Claims, 15 Drawing Sheets

(52) U.S. Cl.
CPC ............... *H03F 2203/45116* (2013.01); *H03F 2203/45511* (2013.01); *H03F 2203/45512* (2013.01); *H03F 2203/45528* (2013.01)

(58) Field of Classification Search
CPC . H03F 2203/45512; H03F 2203/45528; H03F 2203/45524; H03G 2201/502
See application file for complete search history.

(56) References Cited

U.S. PATENT DOCUMENTS

| | | | |
|---|---|---|---|
| 6,307,433 | B1 | 10/2001 | Ikeda |
| 6,629,638 | B1 | 10/2003 | Sanchez |
| 10,535,978 | B2 | 1/2020 | Redman-white et al. |
| 12,300,967 | B2 | 5/2025 | Redman-white et al. |
| 12,498,529 | B2* | 12/2025 | Van Ettinger ........ G02B 6/4274 |
| 2002/0175272 | A1 | 11/2002 | Shimizu |
| 2004/0173729 | A1 | 9/2004 | Shimizu et al. |
| 2005/0047801 | A1* | 3/2005 | Schrodinger ...... H04B 10/6933 |
| | | | 398/202 |
| 2008/0309407 | A1 | 12/2008 | Nakamura et al. |
| 2009/0072903 | A1* | 3/2009 | Bae .................... H03F 3/45098 |
| | | | 330/254 |
| 2009/0080905 | A1 | 3/2009 | Olsson et al. |
| 2010/0141337 | A1* | 6/2010 | Chen ...................... H03F 3/211 |
| | | | 330/124 R |
| 2014/0171003 | A1* | 6/2014 | Mikhemar .............. H03F 1/086 |
| | | | 455/232.1 |
| 2014/0341571 | A1 | 11/2014 | Noda |
| 2015/0188627 | A1 | 7/2015 | Yuda et al. |
| 2015/0381129 | A1 | 12/2015 | Brekelmans |
| 2016/0142026 | A1* | 5/2016 | Kim ........................ H03F 1/223 |
| | | | 330/291 |
| 2016/0248517 | A1 | 8/2016 | Parikh |
| 2017/0105059 | A1* | 4/2017 | Shringarpure ........ H03F 1/0205 |
| 2017/0163352 | A1 | 6/2017 | Sugimoto et al. |
| 2018/0091231 | A1* | 3/2018 | Rodriguez-Perez ........................ H03F 3/45475 |
| 2020/0007087 | A1* | 1/2020 | Sugimoto .............. H03F 3/087 |
| 2020/0412316 | A1* | 12/2020 | Li ....................... H03F 3/45085 |
| 2021/0033644 | A1 | 2/2021 | D'aqiuno et al. |
| 2021/0091740 | A1* | 3/2021 | Lin ...................... H03G 3/3073 |
| 2022/0255509 | A1* | 8/2022 | Liu ........................... H03F 1/26 |
| 2023/0178962 | A1 | 6/2023 | Redman-White et al. |
| 2023/0305246 | A1* | 9/2023 | Van Ettinger ........ G02B 6/4274 |
| 2024/0195371 | A1* | 6/2024 | Ferriss ..................... G05F 1/56 |
| 2024/0195373 | A1* | 6/2024 | Iotti .................... H03F 3/45089 |
| 2024/0195374 | A1* | 6/2024 | Iotti ....................... H03F 3/087 |
| 2024/0283412 | A1* | 8/2024 | Przyborowski ..... H03F 3/45991 |
| 2024/0297719 | A1* | 9/2024 | Van Ettinger .......... H03F 3/082 |
| 2025/0037763 | A1* | 1/2025 | Yin ..................... H03F 3/45475 |
| 2025/0070734 | A1* | 2/2025 | Unterkircher .......... H03F 1/083 |
| 2025/0266797 | A1* | 8/2025 | Li ....................... H03F 3/45744 |
| 2025/0392277 | A1* | 12/2025 | Nisbet .................. H03G 3/3042 |

FOREIGN PATENT DOCUMENTS

| | | | | | |
|---|---|---|---|---|---|
| EP | 0577896 | | 1/1994 | | |
| GB | 2535553 | | 8/2016 | | |
| GB | 2552725 | | 2/2018 | | |
| GB | 2613981 | A * | 6/2023 | .......... | G02B 6/4298 |
| JP | H06252660 | | 9/1994 | | |
| JP | H0774706 | | 3/1995 | | |
| JP | 2006261866 | | 9/2006 | | |
| JP | 2024125156 | A * | 9/2024 | .......... | G02B 6/4298 |

OTHER PUBLICATIONS

Van Ettinger, Rudolf; Non-Final Office Action for U.S. Appl. No. 18/124,216, filed Mar. 21, 2023, mailed Feb. 25, 2025, 26 pgs.

Redman-White, William; Examination Report for United Kingdom application No. GB2117528.6, filed Dec. 3, 2021, mailed Dec. 31, 2021, 6 pgs.

Van Ettinger, Rudolf; Search Report for United Kingdom application No. GB2303182.6, mailed May 2, 2023, 4 pgs.

Hilight Semiconductor Limited; Combined Search and Examination Report for application No. GB2204275.8, mailed Apr. 26, 2022, 11 pgs.

Van Ettinger, Rudolf; Final Office Action for U.S. Appl. No. 18/124,216, filed Mar. 21, 2023, mailed Jun. 3, 2025, 16 pgs.

Van Ettinger, Rudolf; Advisory Action for U.S. Appl. No. 18/124,216, filed Mar. 21, 2023, mailed Aug. 7, 2025, 2 pgs.

Van Ettinger, Rudolf; Notice of Allowance for U.S. Appl. No. 18/124,216, filed Mar. 21, 2023, mailed Sep. 19, 2025, 5 pgs.

Redman-White, William; Requirement for Restriction/Election for U.S. Appl. No. 18/074,063, filed Dec. 2, 2022, mailed Aug. 26, 2024, 6 pgs.

* cited by examiner

TIA Output

Time

701

703

704

702

OPTO-ELECTRONIC ASSEMBLIES

CROSS-REFERENCE TO RELATED APPLICATIONS

This application claims the benefit of United Kingdom Application No. GB2303182.6 filed on Mar. 3, 2023, and entitled "Opto-electronic assemblies," which is incorporated by this reference herein in its entirety.

FIELD OF THE INVENTION

The present application relates to opto-electronic assemblies and receive optical sub-assembly design and construction.

BACKGROUND

High speed optical communication links can be configured in many forms depending on the nature of the physical length of the optical path, the type of fibre and laser used, and the data rate. The main components of a terminal node in a high-speed data optical system are generally similar in function.

In the transmit path, electrical data is passed to circuitry that drives current through a laser and performs modulation of the laser's optical output in a manner that allows information to be conveyed. In the receive path, optical signals are first converted to electrical form and then passed on to various functions, which may perform some manner of signal processing with the goal of providing precise data signals to some client digital functions.

The conversion from the optical signals received from the fibre into electrical signals is typically performed using a photodiode, whose output current is fed to a transimpedance amplifier (TIA) arrangement. The signal arriving from fibre links with a range of attenuation levels can range from very weak to very strong. In order to be able to handle such a range of signal strength, it is common to use an automatic gain control (AGC) system to adjust the gain of the TIA. Such AGC systems are typically implemented using relatively simple circuits due to the demands of maintaining performance over a high bandwidth range. A consequence of the relative simplicity in the circuits is that the TIA response may be seen to vary as the output signal swing becomes large, leading to amplitude non-linearity and to variations in the transient response stability. Both of these effects may cause errors in the subsequent data decision functions in the signal path.

SUMMARY

Technologies are presented herein for providing an improved means for the reception of optical signals with improved amplitude linearity and/or time domain stability in the TIA function. Utilizing the technologies described herein, optical signals may be received and converted to electrical form with substantial improvements in the fidelity of the intended signal waveform and a reduction in errors arising from distortion of the received signal waveform.

According to some embodiments, an assembly of electronic components for reception of data using an optical fibre comprises: a photodiode; a first amplifier coupled to said photodiode; at least one feedback resistor coupled between an output and an input of said amplifier; an arrangement of at least two MOS transistors wherein said at least two MOS transistors are of the same channel polarity, and wherein said at least two MOS transistors are configured to be in parallel with said resistor; a system for sensing a received input signal level, wherein said system is configured to apply a bias voltage to gates of said at least two MOS transistors, said bias voltage being varied by said system according to said received input signal level in a manner to control a resistance apparent through a configuration of said at least two MOS transistors; at least one capacitor configured to couple signals from an output of said amplifier to a gate of at least one of said at least two MOS transistors; and at least one bias resistor configured to couple said bias voltage to a gate of at least one of said at least two MOS transistors.

In further embodiments, said arrangement of said at least two MOS transistors may comprise said MOS transistors arranged so that their channel terminals are in parallel. Said at least one capacitor may be coupled to said output of said amplifier via a first electronic switch. Said at least one capacitor may be coupled to a ground reference terminal via a second electronic switch. A conducting condition of said first electronic switch may be opposite to the conducting condition of said second electronic switch. Said system for sensing said received input signal level may be further configured to provide control signals to set said conducting state of said first and second electronic switches. Said arrangement of said at least two MOS transistors may comprise said MOS transistors configured so that their channel terminals are in series.

In further embodiments, a gate of a first of said at least two MOS transistors may be coupled to receive said bias voltage from said sensing system. A first channel terminal of said first of said at least two MOS transistors may be coupled to an input of said amplifier. A second channel terminal of said first of said at least two MOS transistors may be coupled to a first channel terminal of a second of said at least two MOS transistors. A second channel terminal of said second of said at least two MOS transistors may be coupled to said output of said amplifier. Said gate of said second of said at least two MOS transistors may be coupled to said gate of the said first MOS transistor via said at least one bias resistor. A gate of said second of said at least two MOS transistors may be coupled to said output of said amplifier via said capacitor. Said same channel polarity may be one of: n-channel; and p-channel.

According to further embodiments, a method for providing an assembly of electronic components for reception of data using an optical fibre comprises: providing a photodiode; providing a first amplifier coupled to said photodiode; providing at least one feedback resistor coupled between an output and an input of said amplifier; providing an arrangement of at least two MOS transistors wherein said at least two MOS transistors are of the same channel polarity, and wherein said at least two MOS transistors are configured to be in parallel with said resistor; providing a system for sensing a received input signal level, wherein said system is configured to apply a bias voltage to gates of said at least two MOS transistors, said bias voltage being varied by said system according to said received input signal level in a manner to control a resistance apparent through a configuration of said at least two MOS transistors; providing at least one capacitor configured to couple signals from an output of said amplifier to a gate of at least one of said at least two MOS transistors; and providing at least one bias resistor configured to couple said bias voltage to a gate of at least one of said at least two MOS transistors.

In further embodiments, providing said arrangement of said at least two MOS transistors may comprise providing said MOS transistors arranged so that their channel terminals are in parallel. Providing said at least one capacitor may comprise: coupling said at least one capacitor to said output of said amplifier via a first electronic switch; and coupling said at least one capacitor to a ground reference terminal via a second electronic switch, and wherein a conducting condition of said first electronic switch is opposite to the conducting condition of said second electronic switch. Providing said system for sensing said received input signal level may further comprise providing control signals to set said conducting state of said first and second electronic switches. Providing said arrangement of said at least two MOS transistors may comprise providing said MOS transistors arranged so that their channel terminals are in series.

In further embodiments, providing said arrangement of said at least two MOS transistors may comprise: coupling a gate of a first of said at least two MOS transistors to receive said bias voltage from said sensing system; coupling a first channel terminal of said first of said at least two MOS transistors to an input of said amplifier; coupling a second channel terminal of said first of said at least two MOS transistors to a first channel terminal of a second of said at least two MOS transistors; and coupling a second channel terminal of said second of said at least two MOS transistors to said output of said amplifier. Providing said arrangement of said at least two MOS transistors may comprise: coupling said gate of said second of said at least two MOS transistors to said gate of the said first MOS transistor via said at least one bias resistor; and coupling a gate of said second of said at least two MOS transistors to said output of said amplifier via said capacitor. Said channel polarity may be one of: n-channel; and p-channel.

BRIEF DESCRIPTION OF FIGURES

Some embodiments will now be described by way of example only and with reference to the accompanying drawings in which.

DETAILED DESCRIPTION

The description is not to be taken in a limiting sense but is made merely for the purposes of describing the general principles of the various embodiments.

Figure 1:
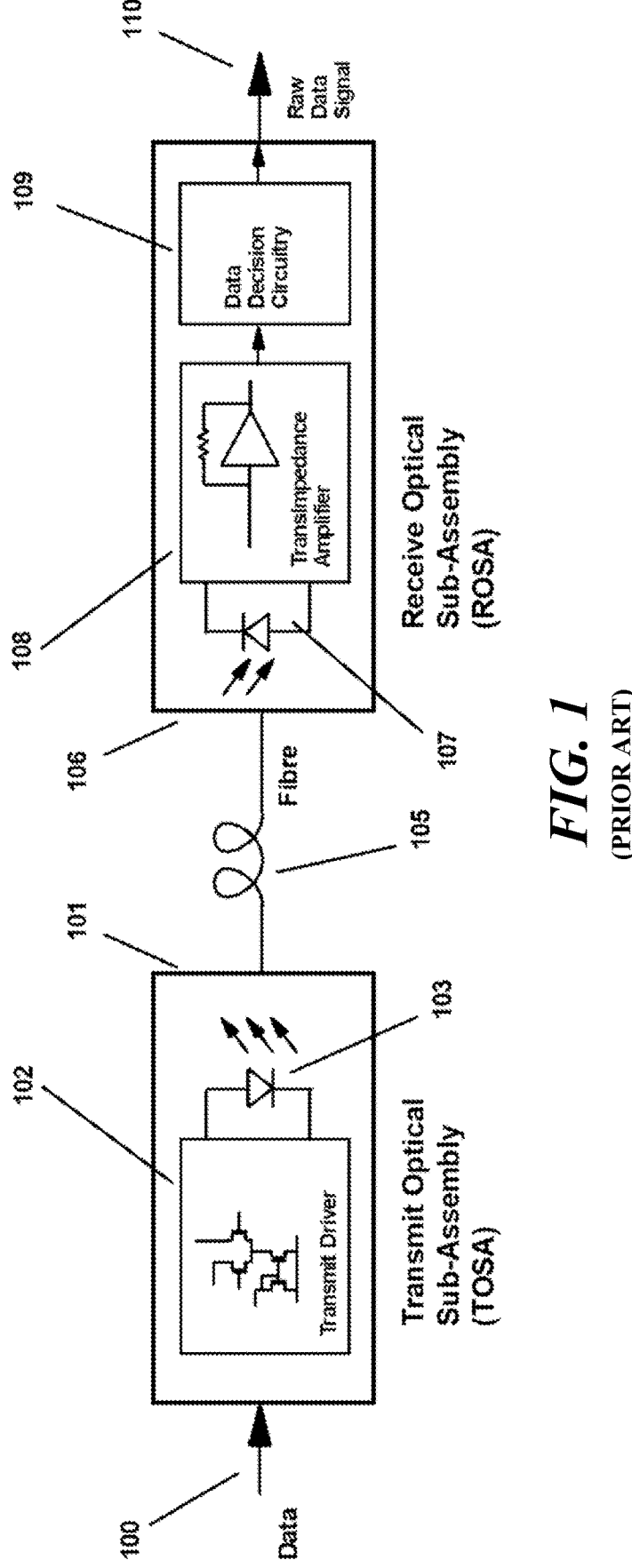
FIG. 1 shows the general arrangement for an optical fibre data communication system according to prior art.

FIG. 1 shows a typical optical communication system according to prior art. The system is shown with a transmit optical sub-assembly (TOSA) 101 configured to receive data 100 and transmit suitable optical signals via a fibre 105. The TOSA 101 can comprise a suitable transmit driver circuit 102 configured to drive a laser or suitable light generating means 103 with a current. The light generating means 103 is furthermore configured to receive the current and generate optical signals for the fibre 105. The system furthermore comprises a Receive Optical Sub-Assembly (ROSA) 106 configured to receive the optical signals and generate a raw data signal 110. The ROSA 106 can comprise a photodiode 107 configured to convert the optical signals arriving via the fibre 105 into a current. This current may be very weak if the optical path through the fibre 105 is long, or may be quite strong if the path is short. Such variations in the generated photocurrent may occur in passive optical networks wherein there are multiple terminal nodes at different locations with different optical path lengths.

Furthermore the ROSA 106 can comprise a transimpedance amplifier (TIA) arrangement 108. The TIA 108 is configured to take the current from the photodiode 107 and typically converts this into a voltage signal large enough to be processed by subsequent electronic circuits, such as the data decision circuitry 109, whose function is to extract the (raw) data signal 110 values from the signal.

Due the abovementioned variations in magnitude of the incoming photocurrent, it is desirable to be able to control the gain of the TIA so that the TIA is not overloaded when signals are strong, and to control signal levels presented to the subsequent circuitry within acceptable limits for correct operation, avoiding undesirable errors in the recovered data.

Figure 2:
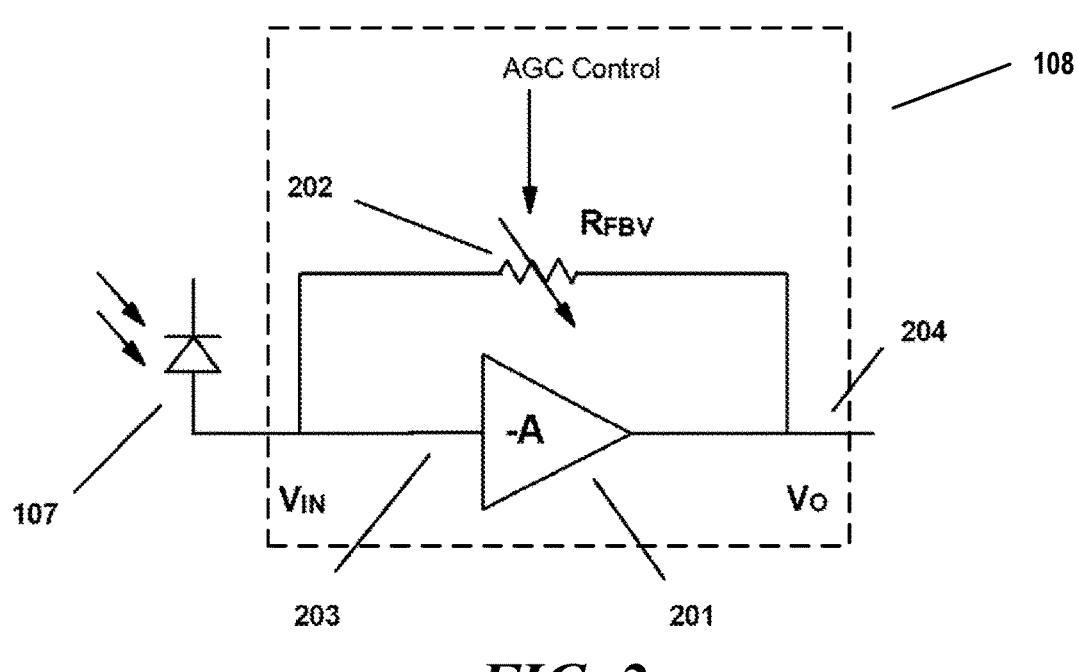
FIG. 2 shows an arrangement for an idealised TIA incorporating AGC as used in the receive path of an optical communication system according to prior art.

FIG. 2 shows a schematic view of an idealised architecture of a typical TIA arrangement 108, wherein the gain is made adjustable under electronic control. At the core of the TIA is an inverting amplifier 201, whose gain is ideally large and having a large signal bandwidth sufficient to provide feedback over the frequency range of the incoming signals, and preferably creating a virtual earth condition at the input 203. The gain is set by the feedback resistance $R_{FBV}$ 202. To adjust the gain, $R_{FBV}$ is made variable. Since the current provided by the photodiode 107 has a DC component that varies with received optical the signal magnitude, the output 204 of the TIA will have a corresponding change in its mean DC level. Such changes can obviously be problematic for the succeeding decision functions.

Figure 3:
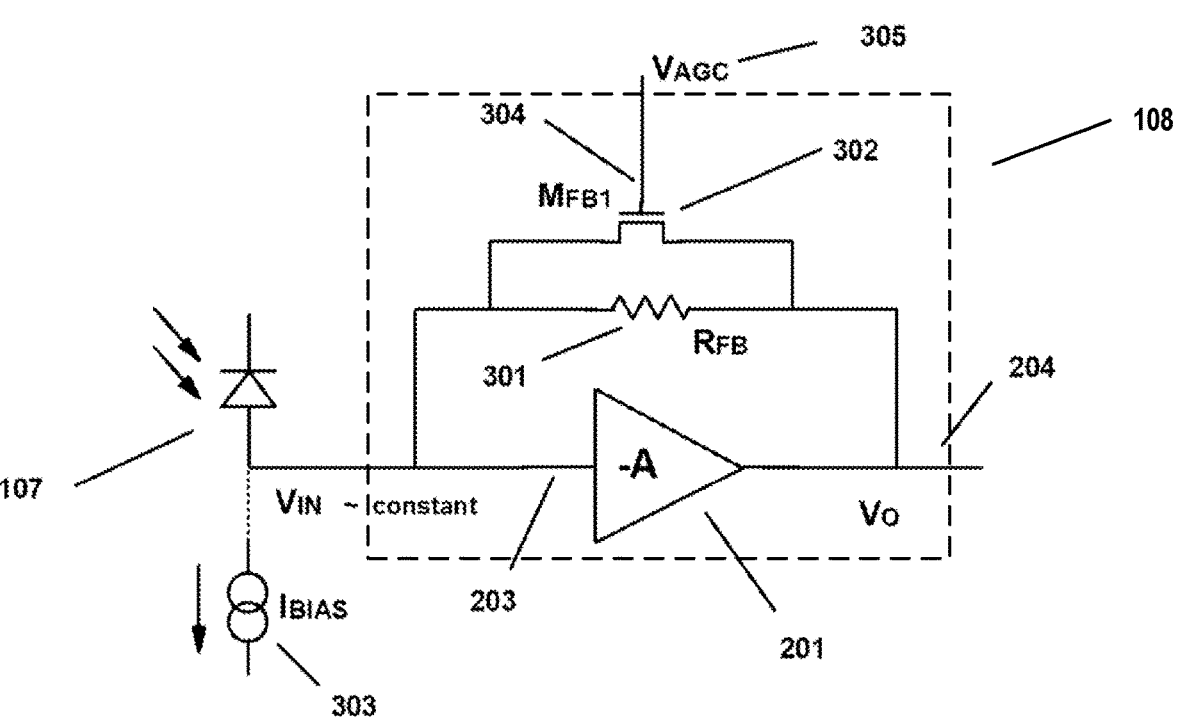
FIG. 3 shows an arrangement for a TIA incorporating AGC as used in the receive path of an optical communication system according to prior art.

FIG. 3 shows an idealised architecture of a typical TIA arrangement 108, wherein the overall (closed loop) gain is made adjustable under electronic control. At the core of the TIA is an inverting amplifier 201, whose gain is ideally large and can preferably create a virtual earth condition at the input 203. The amplifier 201 should also ideally having a large signal bandwidth sufficient to provide feedback over the frequency range of the incoming signals, and for the range of feedback settings used to set the closed loop gain. In addition, a current sink IBIAS 303 provides a path for the DC component of the photodiode 107 current, so that the current input to the TIA is substantially AC in nature, and hence the average value of the TIA output 204 remains stable around a known common mode voltage. The adjustment of said current sink IBIAS 303 to ensure that the DC component of the photodiode current is essentially removed from the TIA input over varying optical signal strength levels is often linked to the gain control mechanism, but may also be a separate function. In the succeeding descriptions of the embodiments, the inclusion or absence of the current sink IBIAS 303 is not further elaborated but one skilled in the art will recognise that said feature can be added where it is not shown explicitly.

To provide a range of feedback resistance values and hence vary the overall closed loop gain of the TIA, it is common to use a metal-oxide-semiconductor field effect transistor (MOSFET) $M_{FB1}$ 302 in parallel with a fixed resistance $R_{FB}$ 301. A control voltage $V_{AGC}$ 305 is applied to the gate 304 of the MOS transistor $M_{FB1}$ 302 to vary the effective resistance seen between the source and drain terminals.

In an ideal implementation, the input terminal 203 of the amplifier 201 at the core of the TIA 108 is substantially constant, that is to say held at a voltage that is nearly constant within appropriate engineering tolerances due to the feedback applied, and hence the bias between the gate 304 of the MOS transistor 302 and one of the channel terminals remains approximately constant. The absolute value of the voltage at the input of the amplifier will depend on the internal bias conditions within said amplifier.

Figure 4:
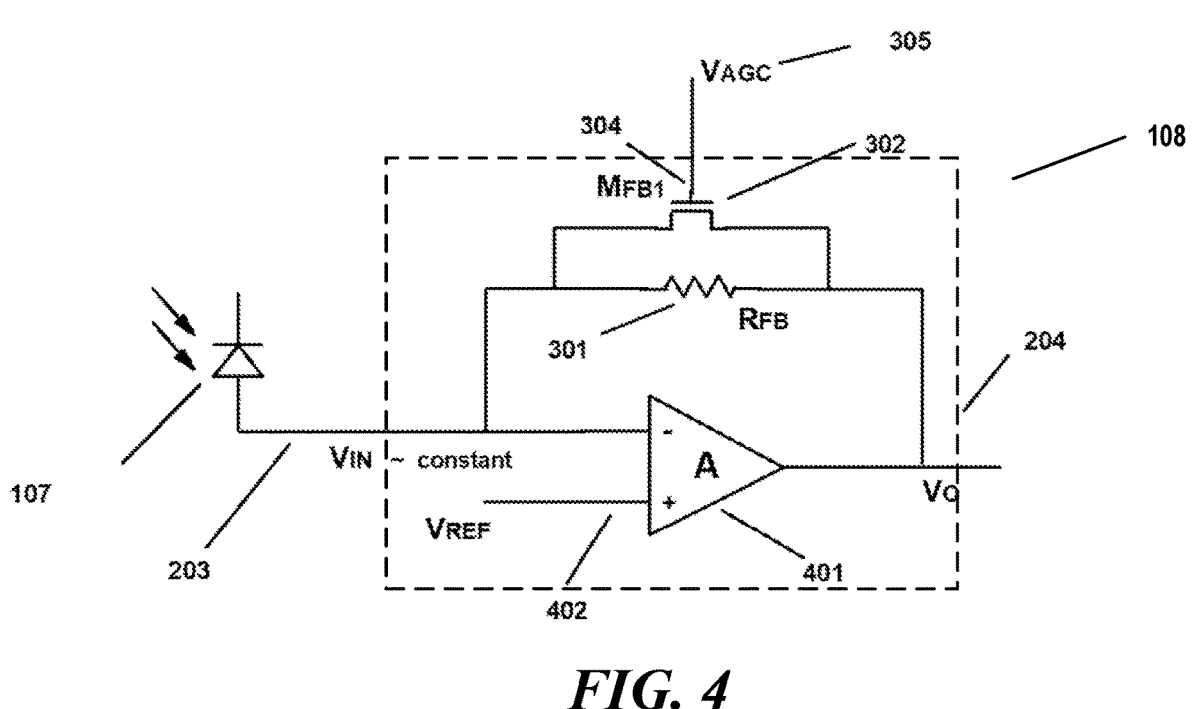
FIG. 4 shows an alternative arrangement for an idealised TIA incorporating AGC as used in the receive path of an optical communication system according to prior art.

FIG. 4 shows an alternative idealised TIA arrangement 108, wherein the amplifier 401 at the core of the TIA has inverting 203 and a non-inverting 402 input terminals. Thus the quiescent voltage seen at the input of said amplifier is defined by the reference voltage applied to the non-inverting 402 input terminal.

Figure 5:
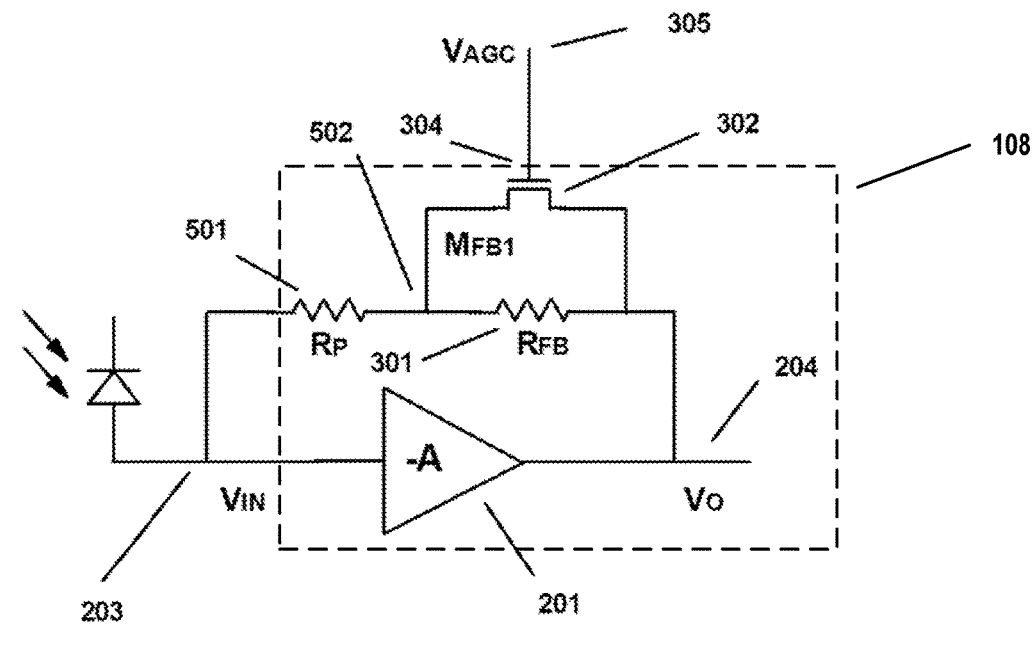
FIG. 5 shows a further arrangement for a TIA incorporating AGC as used in the receive path of an optical communication system according to prior art.

FIG. 5 shows a further idealised TIA arrangement 108, wherein an additional resistance $R_P$ 501 is added to the feedback path, whose purpose is to optimise performance in the condition of maximum sensitivity by taking account of the finite gain A of the inverting amplifier 201 at the core of the TIA 108.

In the arrangement shown in FIG. 4, some of the parasitic capacitances associated with the MOS gain control transistor $M_{FB1}$ 302 will appear at the input node of the amplifier. If the amplifier 201 gain A is insufficient to ensure a nearly ideal virtual earth condition at its input, it follows that there will be charge flowing into and out of said parasitic capacitances, thereby having some effect on the stability and settling behaviour of the TIA. In FIG. 5, the value of RP 501 is set so as to ensure that the connection node 502 between $R_P$ and $R_{FB}$ 301 remains very close to a fixed value under maximum gain conditions. This condition will be satisfied for practical purposes if $R_P$ is approximately equal to $R_{FB}/A$.

In the succeeding descriptions of the embodiments, the inclusion or absence of $R_P$ is not further elaborated upon, but one skilled in the art will recognise that said feature can be easily added where it is not shown explicitly.

Figure 6:
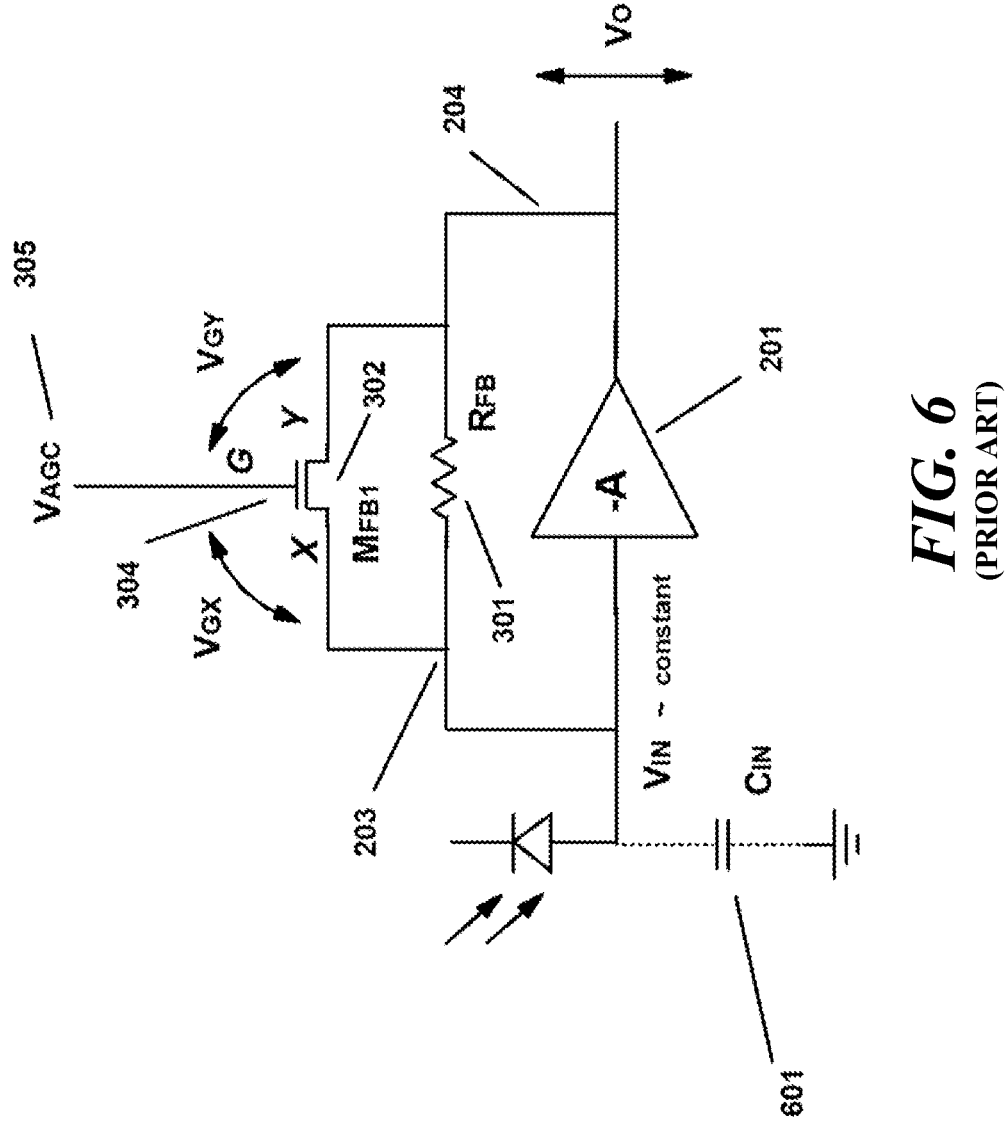
FIG. 6 shows an arrangement for a TIA incorporating AGC as used in the receive path of an optical communication system according to prior art means showing the voltages affecting the AGC control according to prior art.

FIG. 6 shows an ideal TIA implementation with the voltages between the terminals of the MOS transistor shown to provide further clarity in the preceding discussion of the background.

In an ideal TIA implementation, the input terminal 203 of the amplifier 201 at the core of the TIA is held at a near constant voltage due to the feedback applied, and hence the bias between the gate 304 of the MOS transistor $M_{FB1}$ 302 and one of the channel terminals remains approximately constant. In this condition, the effect of parasitic capacitance $C_{IN}$ 601 at the input of the TIA is minimised. However, the signal at the output $V_O$ 204 of the TIA may have an effect on the bias condition of the MOS transistor $M_{FB1}$ 302 used in the feedback path for gain control. For example, if the MOS transistor $M_{FB1}$ 302 is n-channel, then when the output 204 of the TIA has a negative excursion, the effective gate-channel voltage will increase, as denoted by $V_{GI}$, with the potential to turn on the MOS transistor or, if the gate bias 305 provide by the AGC system is just above threshold voltage under quiescent signal conditions, to increase the channel conductivity from a desired nominal value.

During a positive excursion at the output 204 of the amplifier, the gate to channel voltage will be primarily determined by the value of the gate bias 305 relative to the nearly constant voltage at the input 203 of the amplifier, VGX. Thus, if the MOS transistor is biased below threshold it will not turn on. If it is biased above threshold, the channel conductivity will not increase significantly.

Hence, there is some possibility that the instantaneous gain of the TIA could vary significantly as a function of the instantaneous voltage at the output 204 of the TIA. Such a situation could lead to non-linear amplitude responses, and to level-dependent variations in transient settling time due to changing time-constants within the TIA configuration, particularly concerned with the capacitance seen at the input of the amplifier.

In the condition of having a weak input signal from the photodiode 107, the MOS transistor gate voltage 305 will be set below its threshold value for maximum overall gain; the MOS transistor will be cut off and conduct no current between its source and drain terminals. Hence the total feedback resistance is at a maximum solely determined by the value of RFB 301, and thus the overall closed loop gain of the TIA is also at a maximum. In these conditions with the overall gain set to the maximum, while the signal present at the output 204 of the TIA may well have a significant peak-to-peak magnitude, due to the gate bias 305 turning the MOS transistor 302 off, it will typically not be large enough to turn on the MOS transistor even for part of the signal waveform. Hence there is not likely to be significant variation in the closed loop gain as a function of the instantaneous TIA output voltage, nor significant impact on stability and settling behaviour.

In the condition that the signal from the photodiode 107 increases above the minimum sensitivity level, but remains relatively weak, there is a need to begin reducing the overall closed loop gain of the TIA to avoid overloading the TIA and overloading the input of any succeeding functions. Thus the gate voltage $V_{AGC}$ 305 of the MOS transistor 302, relative to the voltage at the input 203 to the amplifier, is raised to a value above the threshold voltage, whereby a conducting channel is formed in the MOS transistor and some feedback signal can flow through this highly resistive path. Hence, the overall feedback resistance is reduced, being the parallel combination of the fixed resistance 301 and the channel resistance of the MOS transistor 302. It is in this condition, where the gate bias is just above the threshold voltage of the MOS transistor MFB1 302, where concerns arise over the instantaneous TIA output signal giving rise to instantaneous gain variations as well as stability and settling time variations.

The latter issue is the key problem that is addressed by embodiments described herein.

When input signal from the photodiode is strong, the gate voltage 305 of the MOS transistor 302 is raised to a value significantly above the threshold value, and a conducting channel is formed between the MOS transistor's source and drain terminals with a low resistance value. This provides an additional feedback path that may dominate over the feedback through the fixed resistance $R_{FB}$ 301. The total combined feedback resistance is now at a minimum value and hence the overall closed loop gain of the TIA is also at a minimum.

In this condition the signal at the output 204 of the TIA will have some effect on the gate to source (taking the effective source as being the more negative end of the channel) bias of the MOS transistor 302, but due to the strong gate bias 305 from the AGC system in the minimum gain condition, the impact on the channel resistance of the MOS transistor will typically be small. Hence the instantaneous gain of the TIA will not vary significantly as a function of the instantaneous voltage at the output of the TIA.

Figure 7:
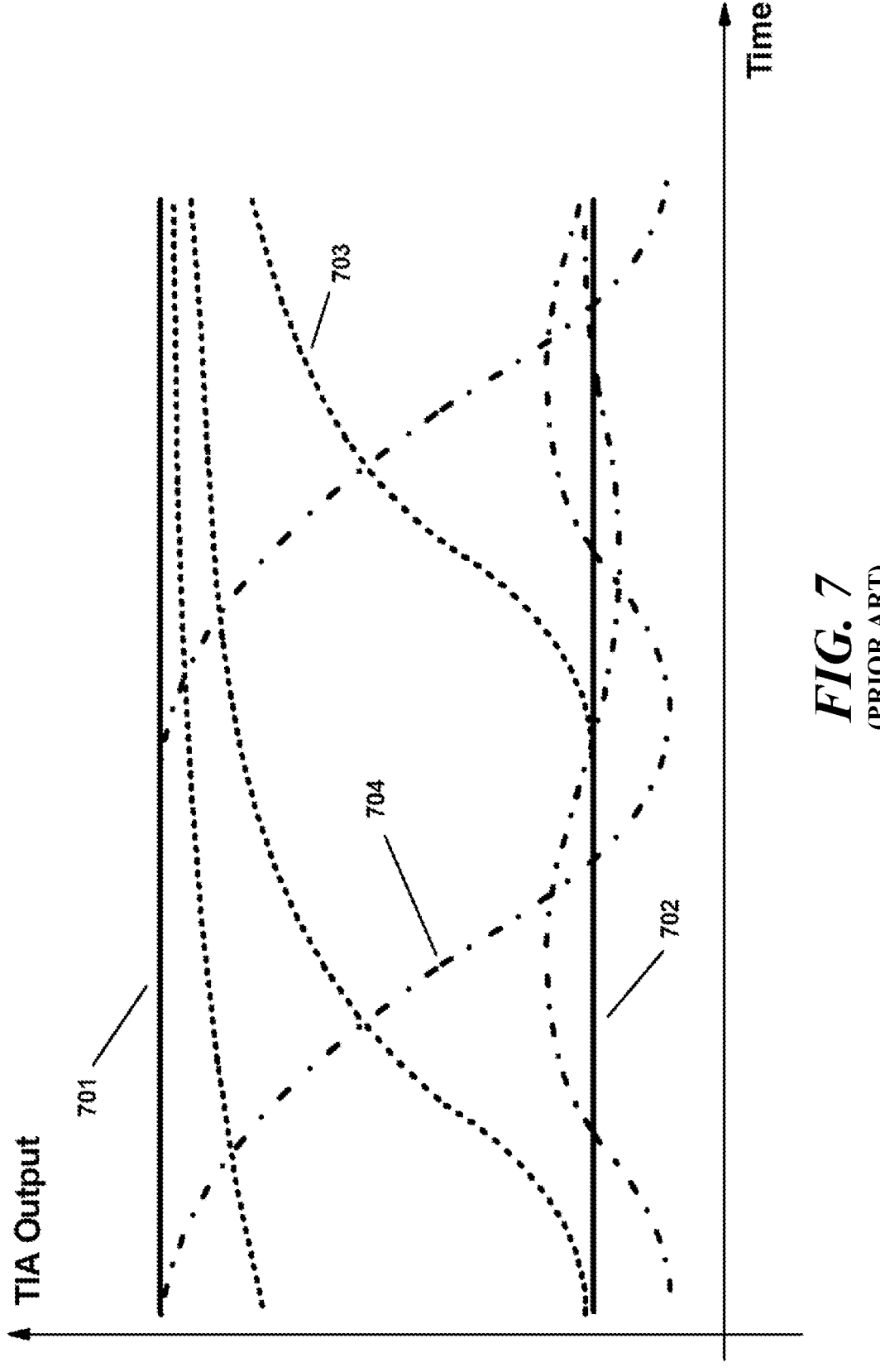
FIG. 7 shows a representation of the output waveforms from a TIA incorporating AGC as used in the receive path of an optical communication system according to prior art

The impact of such fluctuations in the effective feedback impedance while amplifying a small input signal from an optical communications channel is represented in FIG. 7. While the peak 701 and trough 702 levels in the output waveform corresponding to the optical "1" and "0" levels, the changes in the gain and the changes in the capacitance associated with the input of the amplifier can lead to an underdamped ringing response for falling edges 704, and slower overdamped rising edges 703. This behaviour is clearly undesirable where a clean eye pattern is sought for reliable data level decisions in the succeeding functions in the signal path.

One alternative approach to this problem of asymmetric feedback impedance is to use a combination of n-channel and p-channel MOS transistors in parallel. This however presents some challenges in implementation, inasmuch as the bias required for the n-channel and the p-channel MOS transistors will be different and will be required to move in opposite senses. That is to say that if, for example, it is required to decrease the overall gain of the amplifier, the bias applied to the gate of the n-channel MOS transistor would need to be made more positive with respect to $V_{IN}$. At the same time, the bias applied to the gate of the p-channel MOS transistor will need to be made more negative with respect to $V_{IN}$. A design configured to provide such bias voltages to operate the AGC function will necessarily complicated and need to take account of differing threshold voltages. In addition, if the n-channel and p-channel transistors have physical channel dimensions that will provide approximately symmetrical conductivity for positive and negative signal excursions, it is to be expected that the parasitic capacitances associated with each of the MOS transistors will be of different values, with a risk of some asymmetry in overall settling behaviour.

To forestall problems associated with generating two separate AGC voltages, the use of a combination of n-channel and p-channel MOS transistors is avoided, and the example circuit configurations presented below have been developed in order to attempt to overcome the aforementioned problems based solely on the use of MOS transistors of a single channel polarity.

Figure 8:
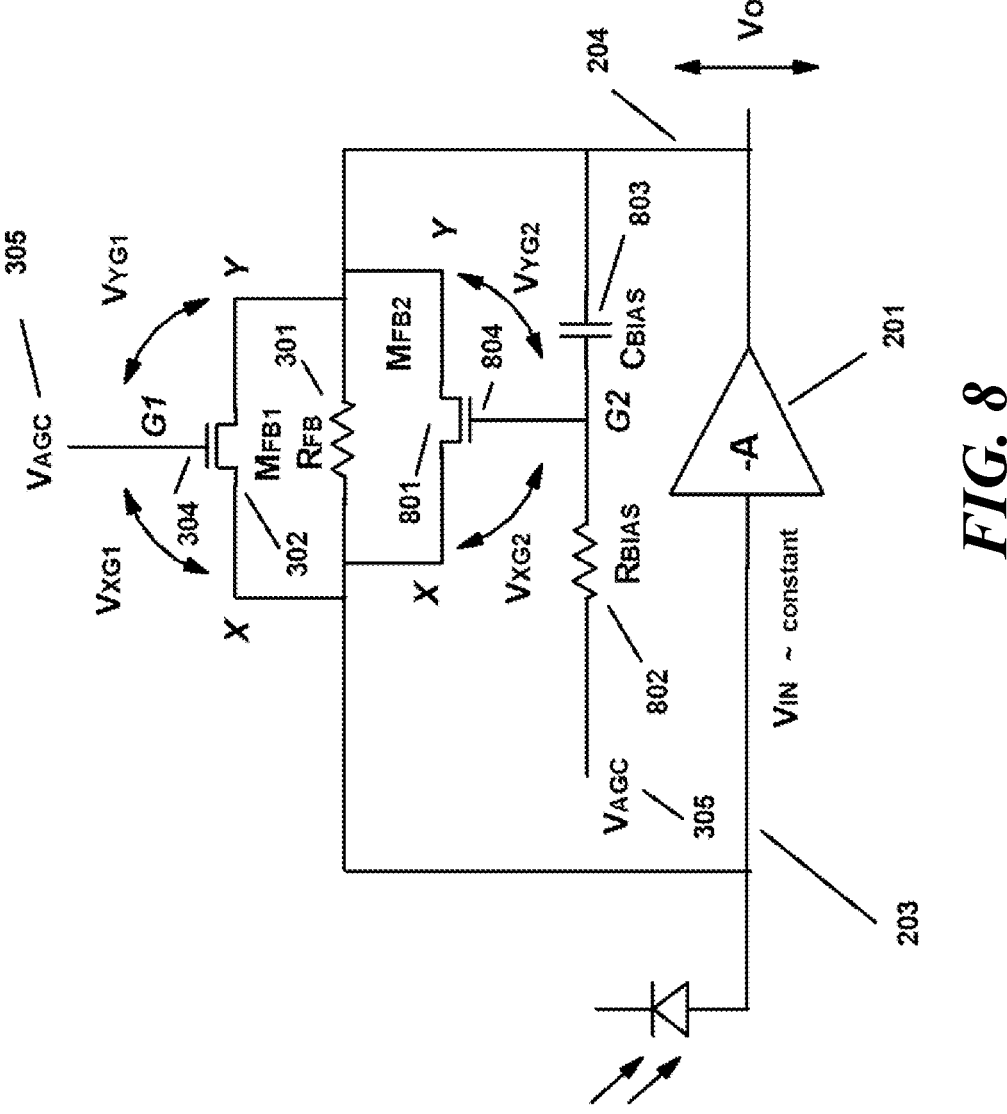
FIG. 8 shows an arrangement for a TIA as used in the receive path of an optical communication system incorporating AGC according to some embodiments.

FIG. 8 shows schematically an example arrangement according to some embodiments wherein a second MOS transistor $M_{FB2}$ 801 is added to the feedback path, in parallel with the fixed feedback resistor $R_{FB}$ 301 and the first MOS transistor $M_{FB1}$ 302. Whilst the gate bias for the first MOS transistor $M_{FB1}$ is supplied directly from a voltage source $V_{AGC}$ 305, the bias for the second MOS transistor $M_{FB2}$ is supplied via a resistor $R_{BIAS}$ 802. The gate 804 of the second MOS transistor $M_{FB2}$ is also connected to the output 204 of the amplifier via a capacitor $C_{BIAS}$ 803. Thus whilst the DC value of the bias at the gate 804 of the second MOS transistor $M_{FB2}$ is set by the source $V_{AGC}$ 305, the gate voltage can have an AC component following the voltage at the output of the amplifier.

In the case of the first MOS transistor $M_{FB1}$ 302, the voltage across the terminals designated X 203 and G1 304 remains essentially fixed with a value equal to $V_{AGC}$-$V_{IN}$, whilst the voltage across the terminals designated Y 204 and G1 304 will vary from this mean value following the signal present at the output 204 of the amplifier.

In the case of the second MOS transistor $M_{FB2}$ 801, the voltage across the terminals designated Y 204 and G2 804 remains essentially fixed with a value essentially equal to $V_{AGC}$-$V_{IN}$ due to the coupling of the output signal 204 to the gate node G2 804 via $C_{BIAS}$ 803, since the average value of $V_O$=$V_{IN}$. However, the voltage across the terminals designated Y 204 and G1 304 will vary following the signal present at the output of the amplifier.

As discussed previously, a critical condition for the TIA shown in FIG. 8 is when the signal from the optical channel is small but above the minimum acceptable value, such that it is necessary to begin reducing the gain of the TIA. In this condition, the value of $V_{AGC}$ 305 is sufficient to just turn on the MOS transistors in the feedback path.

In the arrangement shown in FIG. 8, assuming that MOS transistors $M_{FB1}$ 302 and $M_{FB2}$ 801 are n-channel types, then when there is a positive signal excursion at the output 204 of the amplifier, then the value of $V_{YG1}$ will decrease, but the value of $V_{XG1}$ will remain essentially constant. Since in this condition the node designated X 203 is more negative than the output node designated Y 204, hence the value of $V_{XG1}$ will provide the dominant control over the channel in the MOS transistor $M_{FB1}$ 302, and thus the signal current fed back through this path will not change greatly.

In the case of MOS transistor $M_{FB2}$ 801, the signal from the amplifier output 204, coupled to the gate 804 of said transistor will result in the value of $V_{YG2}$ remaining substantially unchanged. However, the value of $V_{XG2}$ will increase. As the output node designated Y 204 is now more positive than the input node designated X 203, the value of $V_{XG2}$ will provide the dominant control over the channel in the MOS transistor $M_{FB2}$ 801, and thus the signal current fed back through this path will increase.

When there is a negative signal excursion at the output 204 of the amplifier, then the value of $V_{YG1}$ will increase, but the value of $V_{XG1}$ will remain substantially constant. Since in this condition the output node designated Y 204 is more negative than the input node designated X 203, hence the value of $V_{YG1}$ will provide the dominant control over the channel in the MOS transistor $M_{FB1}$ 302, and thus the signal current fed back through this path will increase.

In the case of MOS transistor $M_{FB2}$ 801, the signal from the amplifier output 204, coupled to the gate 804 of said transistor will result in the value of $V_{YG2}$ remaining essentially unchanged. However, the value of $V_{XG2}$ will decrease. As the input node designated X 203 is now more positive than the output node designated Y 204, the value of $V_{YG2}$ will provide the dominant control over the channel in the MOS transistor $M_{FB2}$ 801, and thus the signal current fed back through this path will not change greatly.

Whilst there are clearly variations in the total impedance of the feedback path comprising $R_{FB}$ 301, $M_{FB1}$ 302 and $M_{FB2}$ 801 as a result of the signal excursions at the output 204 of the amplifier, it will be apparent to one skilled in the art that such variations are substantially the same for either positive or negative excursions of the output signal.

Figure 9:
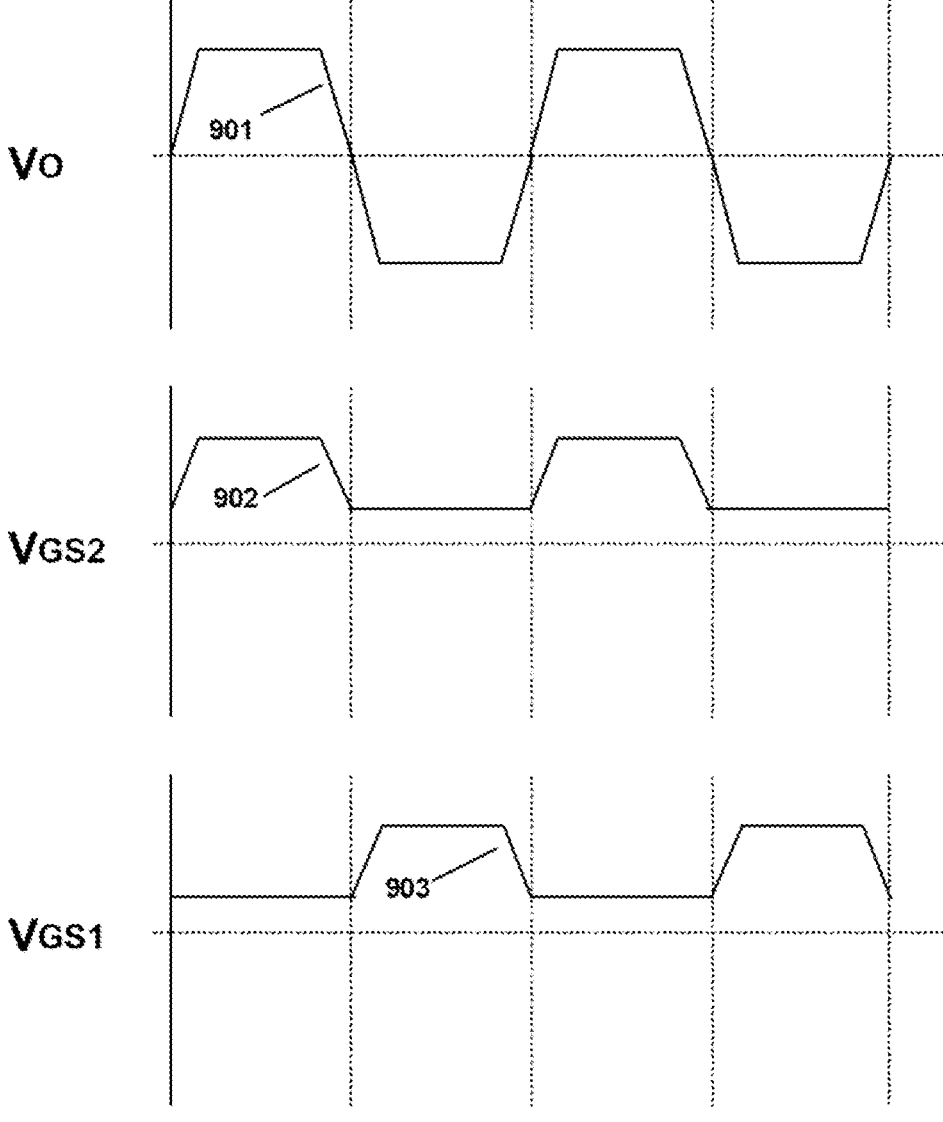
FIG. 9 shows a representation of signal waveforms and device bias values in the arrangement shown in FIG. 8 according to some embodiments.

FIG. 9 shows an idealised representation of the effective gate to source voltage 903 for the MOS transistors $M_{FB1}$, the effective gate to source voltage 902 for the MOS transistors $M_{FB2}$ as a function of the amplifier output signal 901 excursions in the arrangement previously disclosed in FIG. 8. As will be seen, the variations in gate to source voltages, that are the dominant factor determining the instantaneous channel conductivity, are essentially symmetrical with respect to the centre of the data waveform. As a result, the damping of the amplifier's feedback configuration will show more nearly ideal symmetrical behaviour, and thus the recovered data eye pattern will retain symmetry for improved data decisions.

Figure 10:
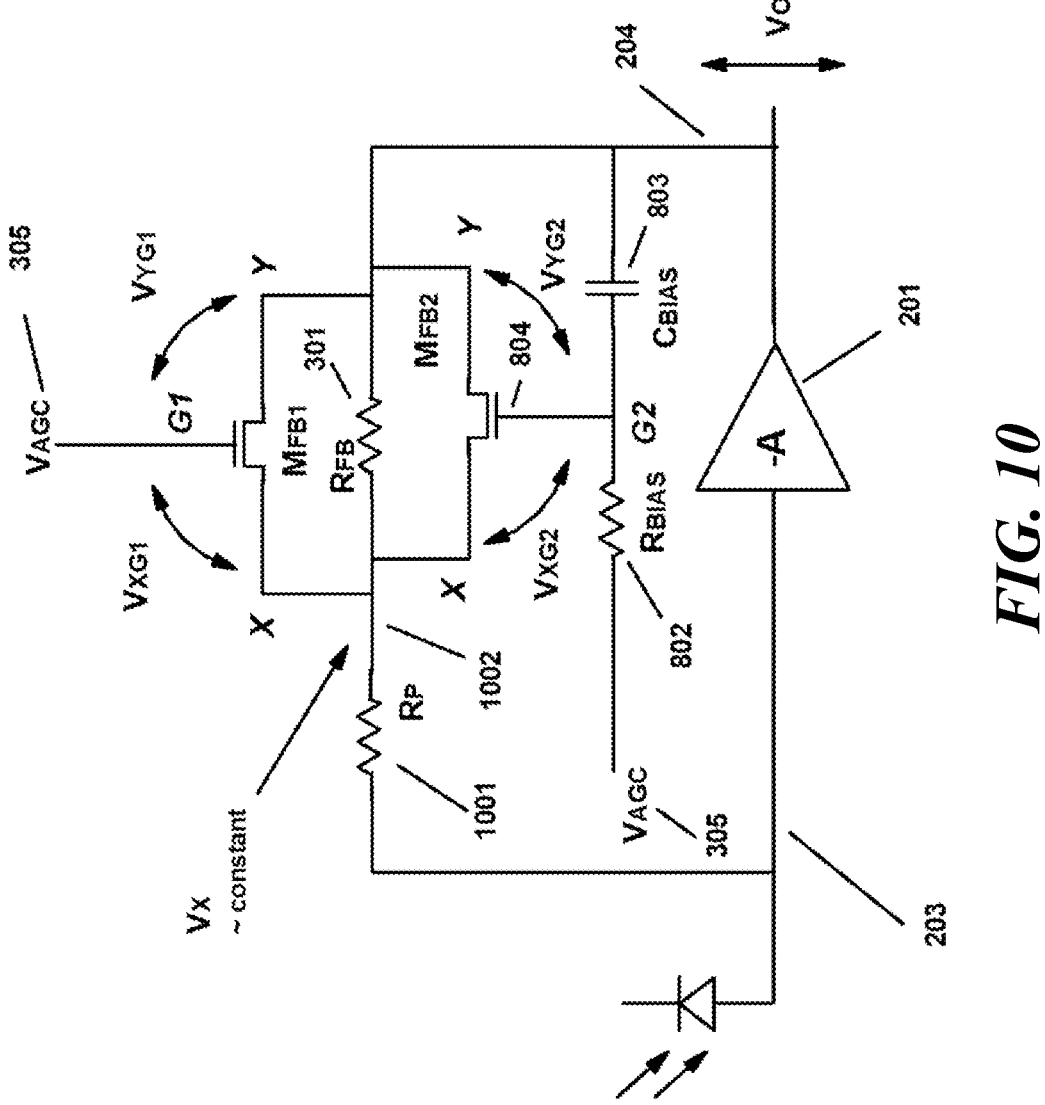
FIG. 10 shows an alternative arrangement for a TIA as used in the receive path of an optical communication system incorporating AGC according to some embodiments.

FIG. 10 shows a variation of the arrangement disclosed in FIG. 8 wherein an additional resistance $R_P$ 1001 has been added. As previously discussed, the addition of a smaller resistor in this way helps to maintain the potential at the node designated X 1002 at a more nearly constant value. This modification may be necessary in cases where the open loop gain of the core is limited such that there is not a near ideal virtual ground for AC signals at its input.

Figure 11:
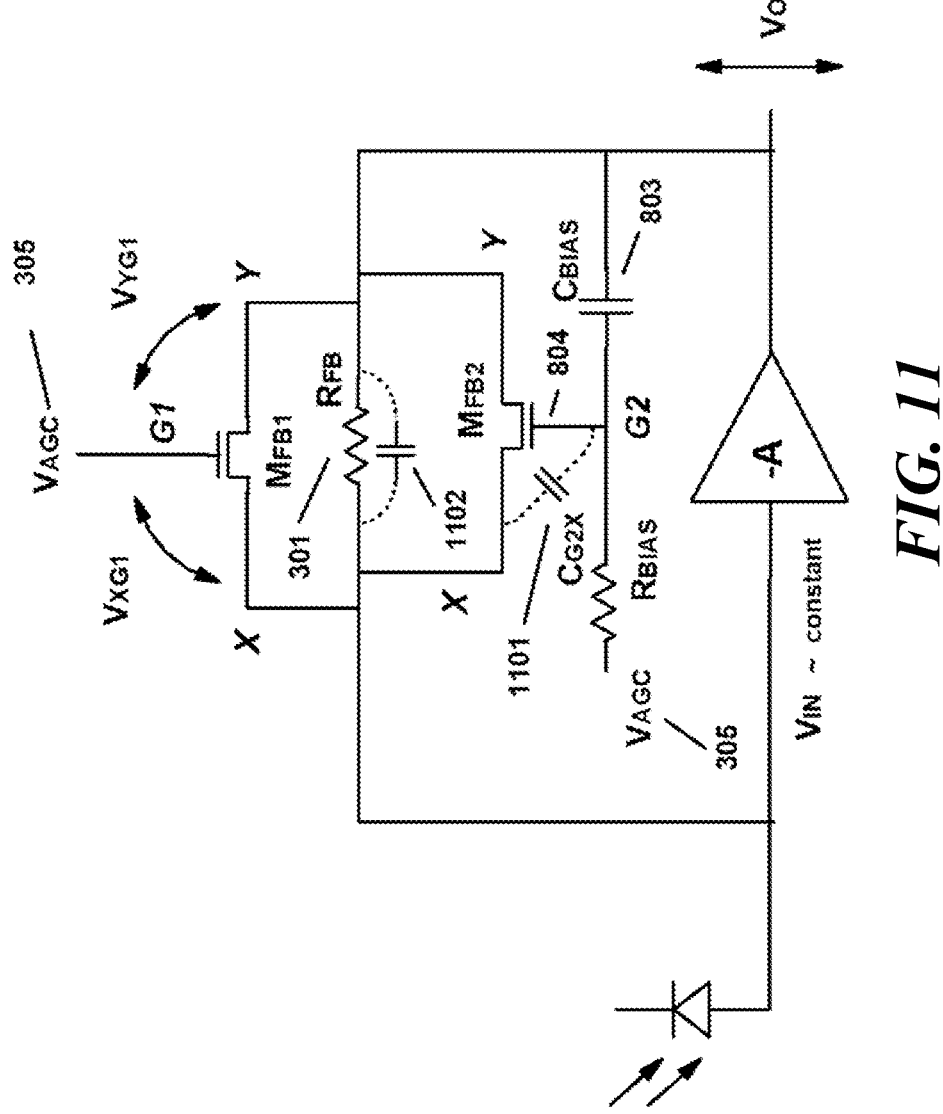
FIG. 11 shows an arrangement for a TIA as used in the receive path of an optical communication system incorporating AGC according to some embodiments illustrating parasitic capacitances.

FIG. 11 shows the presence of some significant parasitic capacitances in the arrangement previously disclosed in FIG. 8. Of most significance is the gate to source capacitance $C_{G2X}$ 1101 of MOS transistor $M_{FB2}$ 801 which now appears in parallel with the feedback resistor $R_{FB}$ 301 due to the coupling from the amplifier output via capacitor $C_{BIAS}$ 803. Any parasitic capacitances 1102 that appear across resistor $R_{FB}$ 301 can have a major impact on overall bandwidth of the TIA, and so it is normal that these are kept to a minimum by layout and other means. The additional capacitance 1101 associated with MOS transistor $M_{FB2}$ 801 will typically be of significant size, and have a very undesirable impact on overall bandwidth of the TIA arrangement.

Figure 12:
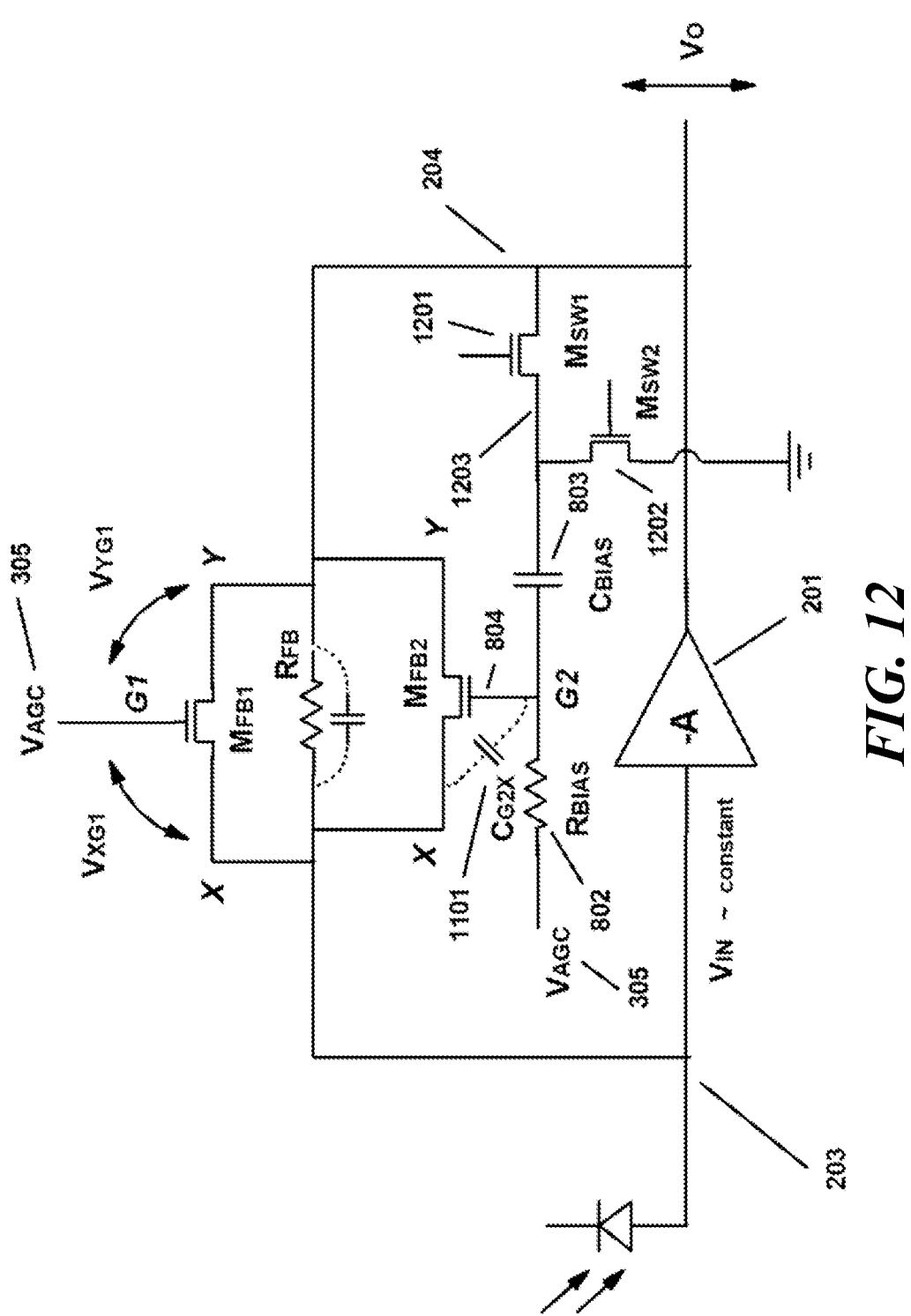
FIG. 12 shows an arrangement for a TIA as used in the receive path of an optical communication system incorporating AGC according to a further embodiments.

FIG. 12 shows an arrangement comprising further improvements to the arrangement disclosed in FIG. 8 according to an embodiment. Two MOS transistors $M_{SW1}$ 1201 and $M_{SW2}$ 1202 are added to provide means for disconnecting the path 1203 from the amplifier output 204 through $C_{BIAS}$ 803 to the gate 804 of $M_{FB2}$ 801, and further to provide means for connecting $C_{BIAS}$ to a ground reference.

Figure 13:
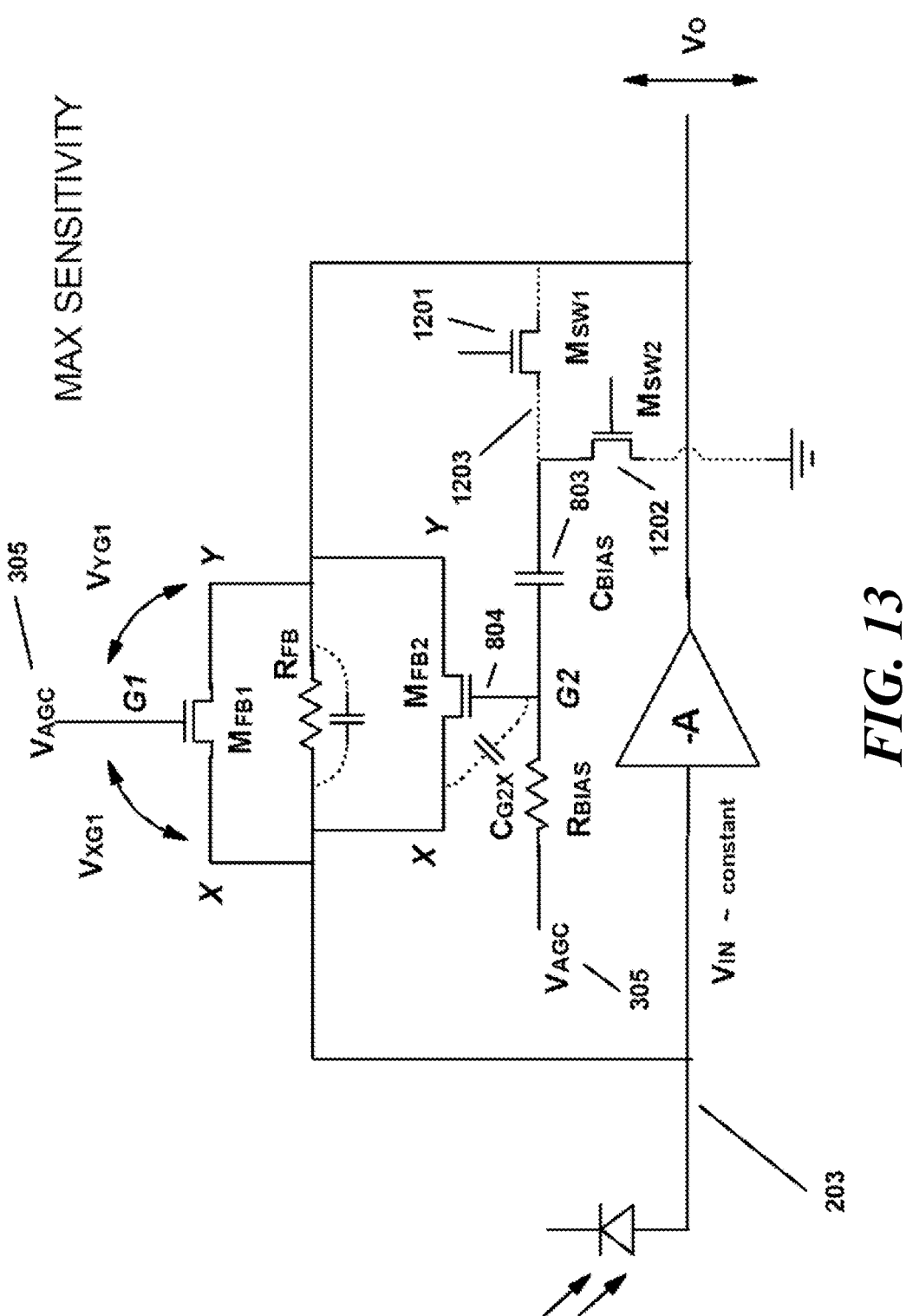
FIG. 13 shows an arrangement for a TIA as used in the receive path of an optical communication system incorporating AGC according to some embodiments used in a high gain configuration.

When $M_{SW1}$ 1201 is off and $M_{SW2}$ 1202 is on as shown in FIG. 13, then MOS transistor $M_{FB1}$ 301 and MOS transistor $M_{FB2}$ 801 both behave in the same fashion, wherein the gate bias voltage appears essentially constant and equal to the value supplied by the AGC source $V_{AGC}$ 305. This is the preferred condition when the input signal is at a minimum level, and both AGC MOS transistors $M_{FB1}$ 302 and $M_{FB2}$ 801 are turned off so that maximum overall gain is achieved in the TIA.

Figure 14:
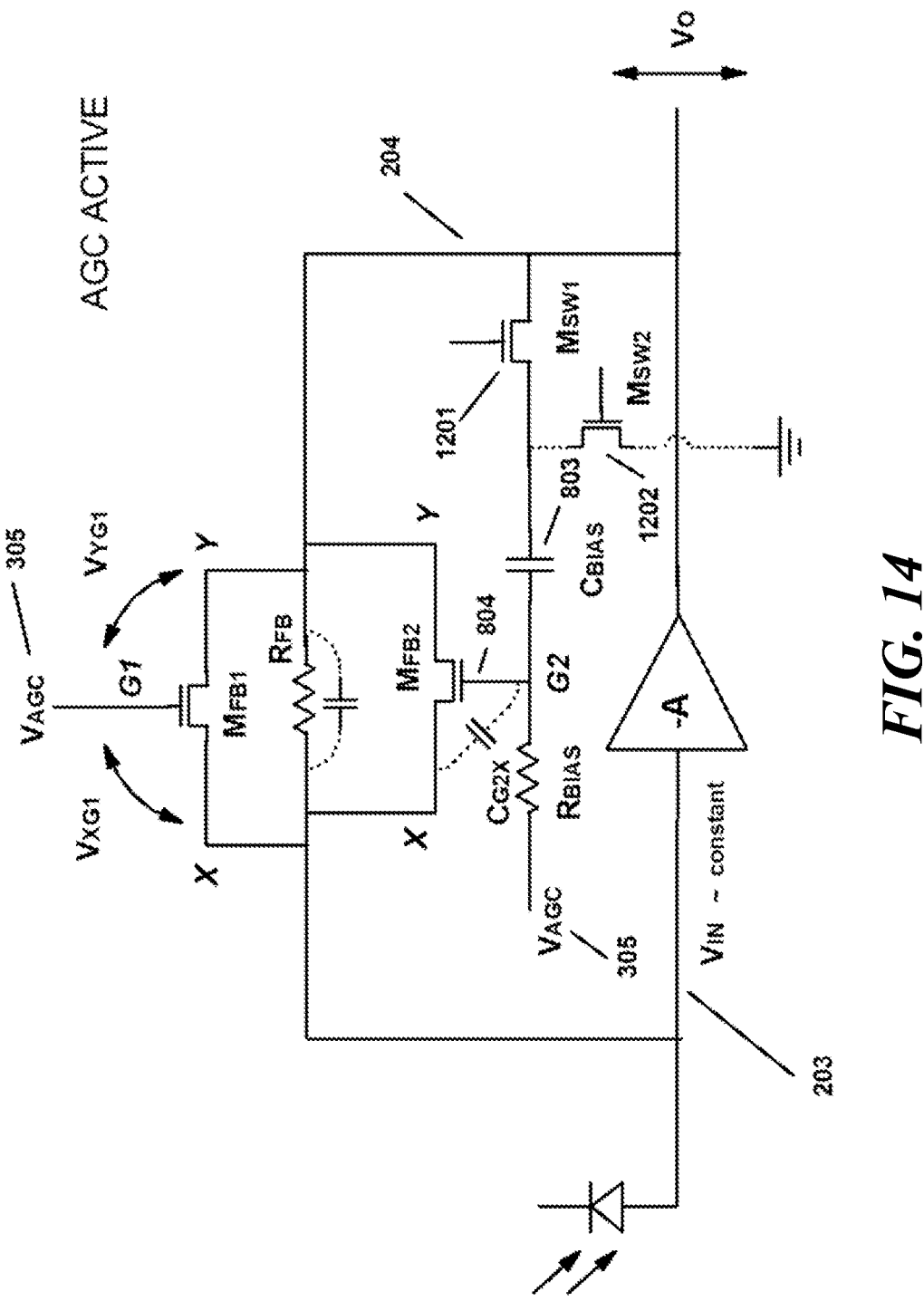
FIG. 14 shows an arrangement for a TIA as used in the receive path of an optical communication system incorporating AGC according to some embodiments used in a controlled gain configuration.

When switching MOS transistor $M_{SW1}$ 1201 is on and switching MOS transistor $M_{SW2}$ 1202 is off as shown in FIG. 14, the circuit behaves as previously described with reference to FIG. 8. This is the preferred condition when the input signal from the optical channel is larger, and the AGC system is activated to reduce the overall gain of the TIA. In this condition the gate 804 of $M_{FB2}$ 801 is now connected to the output 204 for AC signals so as to improve the output waveform symmetry as previously described with reference to FIG. 8.

Figure 15:
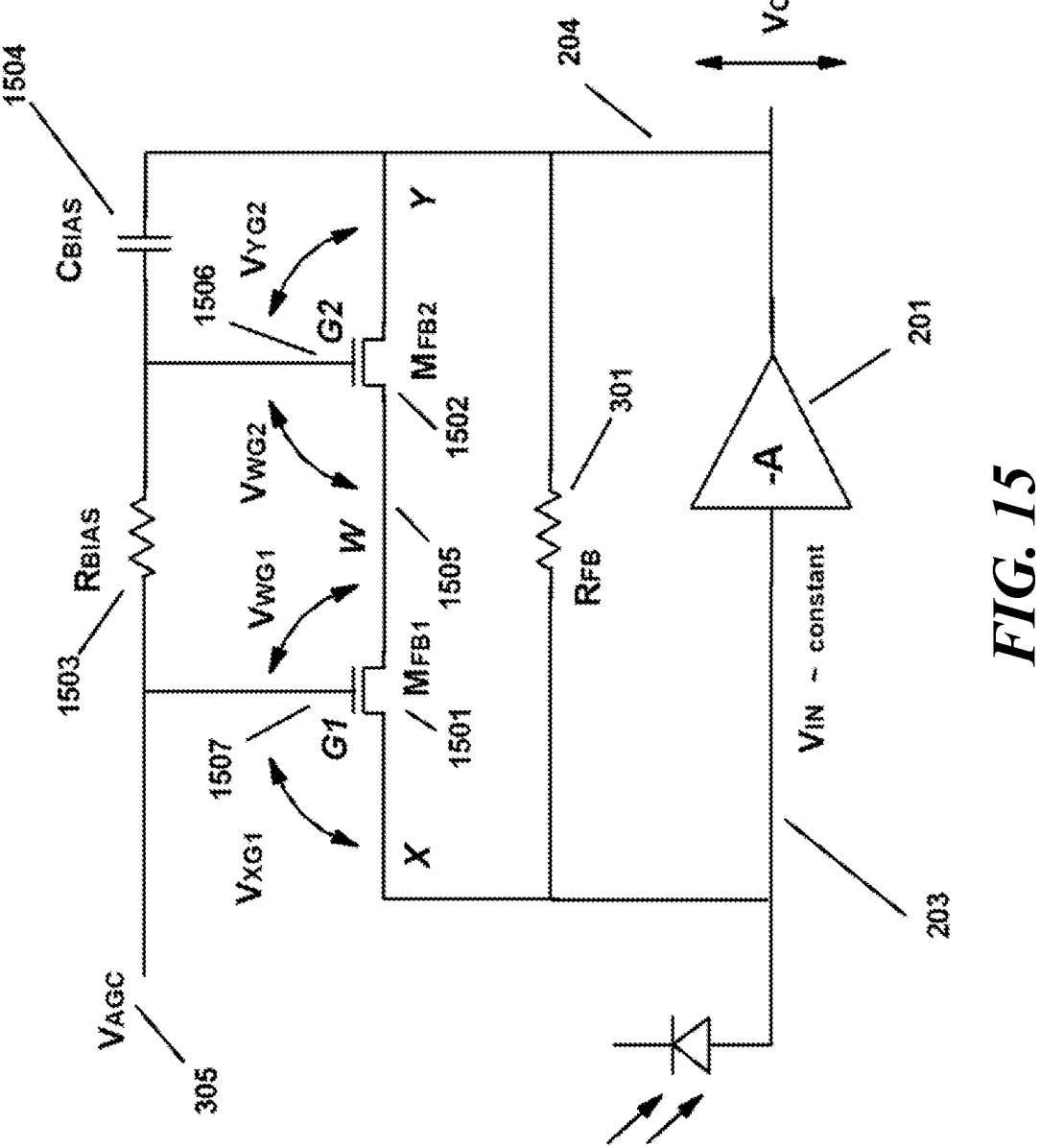
FIG. 15 shows an arrangement for a TIA as used in the receive path of an optical communication system incorporating AGC according to a further embodiments.

FIG. 15 shows an arrangement according to a further embodiment wherein a second MOS transistor $M_{FB2}$ 1502 is added to the feedback path, in series with the a MOS transistor $M_{FB1}$ 1501, and wherein the said series configuration of MOS transistors $M_{FB1}$ 1501 and $M_{FB2}$ 1502 are connected in parallel with the feedback resistor $R_{FB}$ 301. The DC value of the bias to the gates of both MOS transistors is supplied by the voltage source $V_{AGC}$ 305 controlled by the AGC system as previously described. Whilst the gate 1507 of MOS transistor $M_{FB1}$ 1501 is connected directly to said voltage source 305, the gate 1506 of MOS transistor $M_{FB2}$ 1502 is connected on the one hand to the voltage source $V_{AGC}$ 305 via a resistor $R_{BIAS}$ 1503 and also connected to the output 204 of the amplifier via capacitor $C_{BIAS}$ 1504. By these means the voltage at the gate 1506 of MOS transistor $M_{FB2}$ 1502 has a DC value of $V_{AGC}$ but can vary in sympathy with voltage excursions at the output 204 of the amplifier 201.

In the arrangement shown in FIG. 15, consider the situation wherein, as an example, that MOS transistors $M_{FB1}$ 1501 and $M_{FB2}$ 1502 are n-channel types, and that there is a moderate input signal from the optical communication channel such that the AGC system is providing a voltage from $V_{AGC}$ 305 sufficient to turn on the MOS transistors to some degree.

Where there is neither positive nor negative signal excursion from the mean signal value at the amplifier output, designated node W 204, then there will be no signal current flowing through the feedback resistor $R_{FB}$ 301 nor through the channels of MOS transistors $M_{FB1}$ 1501 and $M_{FB2}$ 1502; and hence both MOS transistors will see the gate to source bias value of $V_{AGC}-V_{IN}$, i.e., $V_{XG1}=V_{WG1}=V_{WG2}=V_{YG2}$; thus both MOS transistors will exhibit the same channel conductivity.

When there is a positive signal excursion at the output 204 of the amplifier, then some signal current will flow from the amplifier output node Y 204 to the amplifier input node X 203 through the feedback resistance $R_{FB}$ 301 and through the channels of MOS transistors $M_{FB1}$ 1501 and $M_{FB2}$ 1502, creating a potential difference between the output node Y 204 and the connection between the two MOS transistors node W 1505, and also between nodes W and the input node X 203. In this condition the gate to source bias (taking the effective source as being the more negative end of the channel) seen by MOS transistor $M_{FB1}$ 1501 will remain unchanged since the value of $V_{XG1}$ will remain unchanged. However, as the voltage at the amplifier out node Y 204 rises, so the coupling through capacitor $C_{BIAS}$ 1504 makes the value of the gate voltage of MOS transistor $M_{FB2}$ 1502 rise, having an instantaneous value of approximately $V_{AGC}+V_O-V_{IN}$. Hence the bias applied to MOS transistor $M_{FB2}$ from gate G2 1506 to the appropriate source at node W 1505 output will increase, increasing the channel conductivity, and hence reducing the combined feedback impedance for the TIA. Thus in this condition the total feedback current through the MOS transistors, and typically the overall feedback determining the overall gain of the TIA will tend to become controlled by the conductivity of $M_{FB1}$ 1501 which has a nearly constant gate to source bias.

When there is a negative signal excursion at the output 204 of the amplifier, then some signal current will flow from the amplifier input node X 203 to the amplifier output node Y 204 through the feedback resistance $R_{FB}$ 301 and through the channels of MOS transistors $M_{FB1}$ 1501 and $M_{FB2}$ 1502, creating a potential difference between the amplifier input node X 203 and the node formed by the connection of the channels of the two MOS transistors W 1505 and similarly between node W 1505 and the amplifier output node Y 204. Since the voltage at node W 1505 will now be lower than the voltage at node X 203 the bias seen from the gate 1507 to the source node 1505 (taking the effective source as being the more negative end of the channel) of MOS transistor $M_{FB1}$ 1501 will increase, increasing the conductivity of its channel. The voltage at the output of the amplifier designated node Y 204 will be even more negative with respect the voltage at node W 1505, but due to the coupling through capacitor $C_{BIAS}$ 1504 and the isolation provided by $R_{BIAS}$ 1503, the bias seen by MOS transistor $M_{FB2}$ 1502 from the gate 1506 to the source (taking the effective source as being the more negative end of the channel) node 204 will remain at the nominal value of $V_{AGC}-V_{IN}$. Thus in this condition the total feedback current through the MOS transistors, and typically the overall feedback determining the overall gain of the TIA will tend to become controlled by the conductivity of $M_{FB2}$ 1502 which has a nearly constant gate to source bias.

As will be apparent to one skilled in the art, the combined resistance presented by the two MOS transistors in series will reduce during both positive and negative signal excursions present at the output of the amplifier at node Y 204. Thus the instantaneous gain of the TIA will vary, but in a manner that is symmetrical within acceptable engineering tolerances with respect the mean value of the received data signal. Thus, the recovered eye pattern presented to the succeeding decision functions in the signal chain will also be maintained symmetrical within acceptable engineering tolerances.

Figure 16:
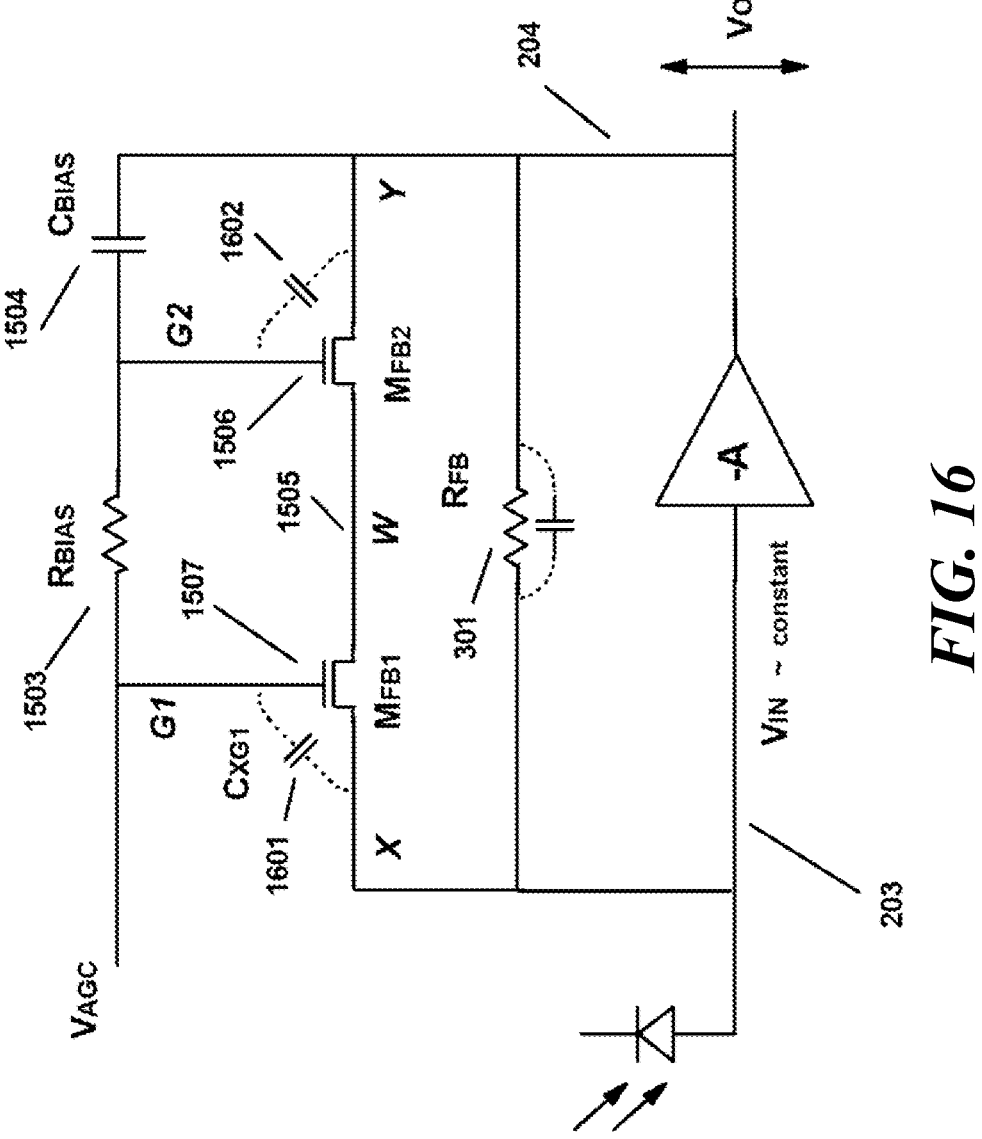
FIG. 16 shows an arrangement for a TIA as used in the receive path of an optical communication system incorporating AGC according to some embodiments.

FIG. 16 shows the arrangement presented in FIG. 15 with the effects of the parasitic capacitances associated with the MOS transistors used for gain control. The important feature here is that the gate to source capacitance 1601 of MOS transistor $M_{FB1}$ 1501 cannot pass signal through the feedback path, but instead this capacitance appears connected to the gain control bias source $V_{AGC}$ 305. This source will normally be decoupled so that is appears as a ground for AC signals. The gate to source capacitance 1602 of MOS transistor $M_{FB2}$ 1502 effectively appears in parallel with $C_{BIAS}$ 1504. Although connected to the output of the amplifier at node Y 204, there is no significant capacitive path through the series connection of the two MOS transistors that can appear in parallel with the feedback resistance $R_{FB}$ 301. Thus this arrangement of the MOS transistors $M_{FB1}$ 1501 and $M_{FB2}$ 1502 used to control the overall gain has a much reduced impact on bandwidth and stability.

Figure 17:
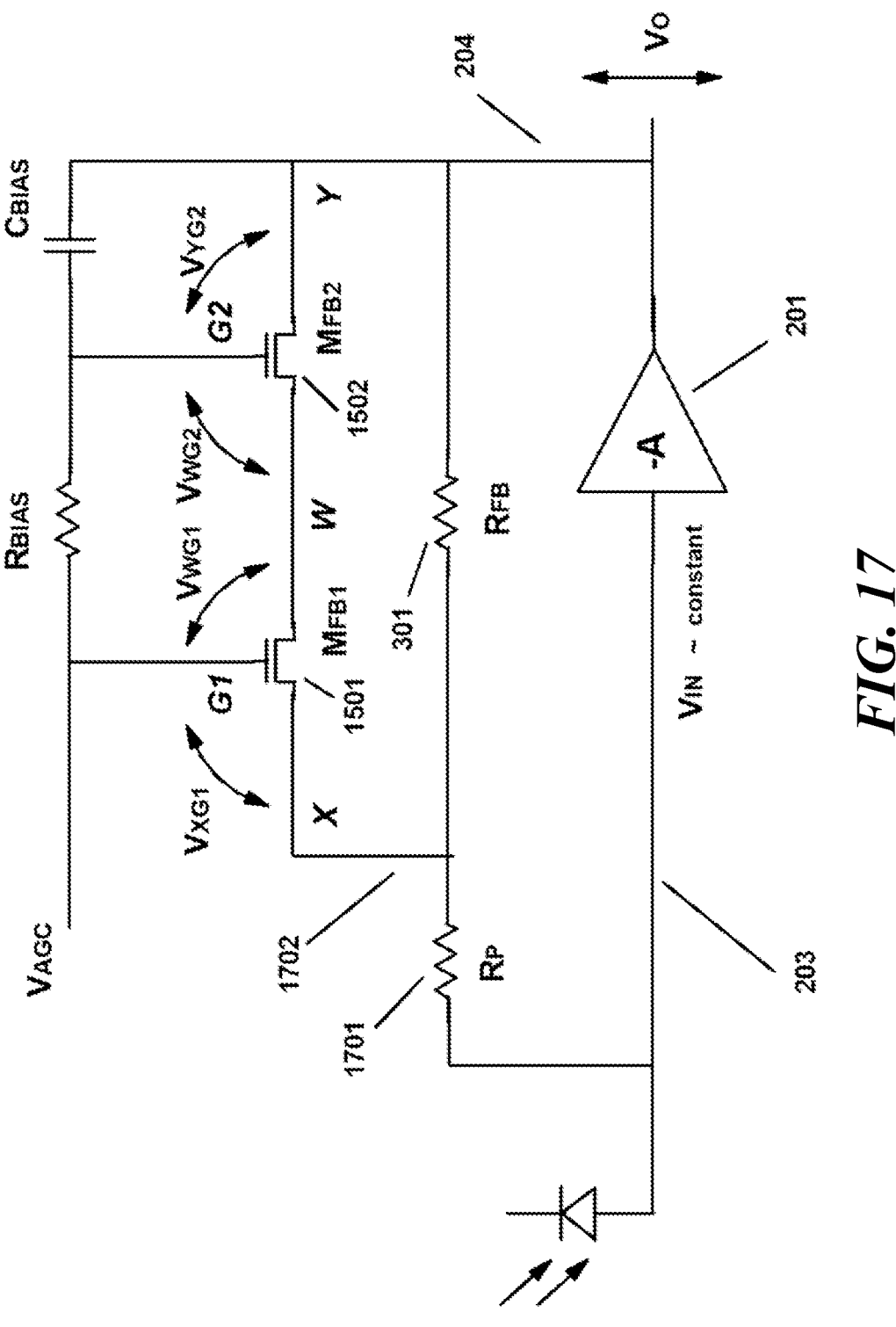
FIG. 17 shows an arrangement for a TIA as used in the receive path of an optical communication system incorporating AGC according to some embodiments.

FIG. 17 shows the arrangement disclosed in FIG. 15 with the addition of resistor $R_P$ 1701, whose purpose is make the voltage seen at node X 1702 more nearly constant in the situation where the amplifier 201 has limited gain and the input 203 of said amplifier cannot be maintained in the condition of an ideal virtual earth. This does not materially affect the behaviour of the bias conditions seen by the gain control MOS transistors $M_{FB1}$ 1501 and $M_{FB2}$ 1502, and hence the desired symmetry of gain variations is maintained.

Whilst inventions are described herein with reference to particular examples and possible embodiments thereof, these should not be interpreted as restricting the scope of the inventions in any way. It is to be made clear that many other possible embodiments, modifications and improvements may be incorporated into or with the inventions without departing from the scope and spirit of any particular invention as set out in the claims.

What is claimed is:

1. An assembly of electronic components for reception of data using an optical fibre, wherein said assembly comprises:

a photodiode;

an amplifier coupled to said photodiode;

at least one feedback resistor coupled between an output and an input of said amplifier;

an arrangement of at least two MOS transistors, wherein said at least two MOS transistors are of the same channel polarity, and wherein said at least two MOS transistors are configured to be in parallel with said at least one feedback resistor;

a system for sensing a received input signal level, wherein said system is configured to apply a bias voltage to gates of said at least two MOS transistors, said bias voltage being varied by said system according to said received input signal level in a manner to control a resistance apparent through said arrangement of said at least two MOS transistors;

at least one capacitor configured to couple signals from an output of said amplifier to a gate of at least one of said at least two MOS transistors; and at least one bias resistor configured to couple said bias voltage to a gate of at least one of said at least two MOS transistors.

2. The assembly of electronic components as claimed in claim 1, wherein said arrangement of said at least two MOS transistors comprises said at least two MOS transistors arranged so that their channel terminals are in parallel.

3. The assembly of electronic components as claimed in claim 2, wherein:

said at least one capacitor is coupled to said output of said amplifier via a first electronic switch; and said at least one capacitor is coupled to a ground reference terminal via a second electronic switch, and wherein a conducting condition of said first electronic switch is opposite to the conducting condition of said second electronic switch.

4. The assembly of electronic components as claimed in claim 3, wherein said system for sensing said received input signal level is further configured to provide control signals to set said conducting state of said first and second electronic switches.

5. The assembly of electronic components as claimed in claim 1, wherein said arrangement of said at least two MOS transistors comprises said at least two MOS transistors configured so that their channel terminals are in series.

6. The assembly of electronic components as claimed in claim 5, wherein:

a gate of a first of said at least two MOS transistors is coupled to receive said bias voltage from said sensing system;

a first channel terminal of said first of said at least two MOS transistors is coupled to an input of said amplifier;

a second channel terminal of said first of said at least two MOS transistors is coupled to a first channel terminal of a second of said at least two MOS transistors; and a second channel terminal of said second of said at least two MOS transistors is coupled to said output of said amplifier.

7. The assembly of electronic components as claimed in claim 6, wherein:

said gate of said second of said at least two MOS transistors is coupled to said gate of the said first of said at least two MOS transistors via said at least one bias resistor; and a gate of said second of said at least two MOS transistors is coupled to said output of said amplifier via said capacitor.

8. The assembly of electronic components as claimed in claim 1, wherein said same channel polarity comprises one of: n-channel and p-channel.

9. A method for providing an assembly of electronic components for reception of data using an optical fibre, wherein said method comprises:

providing a photodiode;

providing an amplifier coupled to said photodiode;

providing at least one feedback resistor coupled between an output and an input of said amplifier;

providing an arrangement of at least two MOS transistors, wherein said at least two MOS transistors are of the same channel polarity, and wherein said at least two MOS transistors are configured to be in parallel with said resistor;

providing a system for sensing a received input signal level, wherein said system is configured to apply a bias voltage to gates of said at least two MOS transistors, said bias voltage being varied by said system according to said received input signal level in a manner to control a resistance apparent through an arrangement of said at least two MOS transistors;

providing at least one capacitor configured to couple signals from an output of said amplifier to a gate of at least one of said at least two MOS transistors; and providing at least one bias resistor configured to couple said bias voltage to a gate of at least one of said at least two MOS transistors.

10. The method as claimed in claim 9, wherein providing said arrangement of said at least two MOS transistors comprises providing said at least two MOS transistors arranged so that their channel terminals are in parallel.

11. The method as claimed in claim 10, wherein providing said at least one capacitor comprises:

coupling said at least one capacitor to said output of said amplifier via a first electronic switch; and coupling said at least one capacitor to a ground reference terminal via a second electronic switch, and wherein a conducting condition of said first electronic switch is opposite to the conducting condition of said second electronic switch.

12. The method as claimed in claim 11, wherein providing said system for sensing said received input signal level further comprises providing control signals to set said conducting state of said first and second electronic switches.

13. The method as claimed in claim 9, wherein providing said arrangement of said at least two MOS transistors comprises providing said at least two MOS transistors arranged so that their channel terminals are in series.

14. The method as claimed in claim 13 wherein providing said arrangement of said at least two MOS transistors comprises:

coupling a gate of a first of said at least two MOS transistors to receive said bias voltage from said sensing system;

coupling a first channel terminal of said first of said at least two MOS transistors to an input of said amplifier;

coupling a second channel terminal of said first of said at least two MOS transistors to a first channel terminal of a second of said at least two MOS transistors; and coupling a second channel terminal of said second of said at least two MOS transistors to said output of said amplifier.

15. The method as claimed in claim 14, wherein providing said arrangement of said at least two MOS transistors comprises:

coupling said gate of said second of said at least two MOS transistors to said gate of the said first of said at least two MOS transistors via said at least one bias resistor; and coupling a gate of said second of said at least two MOS transistors to said output of said amplifier via said capacitor.

16. The method as claimed in claim 9, wherein said same channel polarity is one of n-channel and p-channel.

* * * * *